US012046792B2

(12) United States Patent
Ooi et al.

(10) Patent No.: US 12,046,792 B2
(45) Date of Patent: Jul. 23, 2024

(54) TRANSMISSION LINE SUBSTRATE AND ELECTRONIC DEVICE

(71) Applicant: Murata Manufacturing Co., Ltd., Nagaokakyo (JP)

(72) Inventors: Kosuke Ooi, Nagaokakyo (JP); Shingo Ito, Nagaokakyo (JP); Hiromasa Koyama, Nagaokakyo (JP); Genro Kato, Nagaokakyo (JP); Kotaro Mishima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 355 days.

(21) Appl. No.: 17/514,215

(22) Filed: Oct. 29, 2021

(65) Prior Publication Data
US 2022/0077555 A1 Mar. 10, 2022

Related U.S. Application Data

(63) Continuation of application No. PCT/JP2020/025996, filed on Jul. 2, 2020.

(30) Foreign Application Priority Data

Jul. 31, 2019 (JP) ................. 2019-141239

(51) Int. Cl.
*H01P 3/08* (2006.01)
*H01P 3/00* (2006.01)
(Continued)

(52) U.S. Cl.
CPC .............. *H01P 3/088* (2013.01); *H01P 3/003* (2013.01); *H01P 3/10* (2013.01); *H05K 1/0242* (2013.01);
(Continued)

(58) Field of Classification Search
CPC .... H01P 3/088; H01P 3/00; H01P 3/10; H01P 3/082
(Continued)

(56) References Cited

U.S. PATENT DOCUMENTS

2012/0274423 A1  11/2012  Kato
2017/0125870 A1   5/2017  Baba et al.
(Continued)

FOREIGN PATENT DOCUMENTS

JP        3173143 U      1/2012
WO    2016/088592 A1    6/2016
WO    2019/098012 A1    5/2019

OTHER PUBLICATIONS

Official Communication issued in International Patent Application No. PCT/JP2020/025996, mailed on Sep. 15, 2020.

*Primary Examiner* — Rakesh B Patel
(74) *Attorney, Agent, or Firm* — Keating & Bennett, LLP

(57) ABSTRACT

A transmission line substrate includes a line portion, a base including a first main surface and a second main surface opposite to the first main surface, first and second ground conductors, and a signal line. The first ground conductor is on the first main surface side. The second ground conductor is on the second main surface side. The first ground conductor includes first conductor-non-formed portions overlapping the signal line when viewed in the Z axis direction. The second ground conductor includes second conductor-non-formed portions overlapping the signal line when viewed in the Z axis direction. A total area of the second conductor-non-formed portions is less than a total area of the first conductor-non-formed portions.

17 Claims, 13 Drawing Sheets

(51) Int. Cl.
*H01P 3/10* (2006.01)
*H05K 1/02* (2006.01)
*H05K 3/28* (2006.01)
(52) U.S. Cl.
CPC ....... *H05K 3/28* (2013.01); *H05K 2201/0141* (2013.01)
(58) Field of Classification Search
USPC .................................................. 333/204–208
See application file for complete search history.

(56) References Cited

U.S. PATENT DOCUMENTS

2020/0267832 A1     8/2020   Koyama
2020/0396826 A1*   12/2020   Yosui ........................ H01P 3/08

* cited by examiner

TRANSMISSION LINE SUBSTRATE AND ELECTRONIC DEVICE

CROSS REFERENCE TO RELATED APPLICATIONS

This application claims the benefit of priority to Japanese Patent Application No. 2019-141239 filed on Jul. 31, 2019 and is a Continuation Application of PCT Application No. PCT/JP2020/025996 filed on Jul. 2, 2020. The entire contents of each application are hereby incorporated herein by reference.

BACKGROUND OF THE INVENTION

1. Field of the Invention

The present invention relates to a transmission line substrate, which includes a signal line and two ground conductors sandwiching the signal line in between, and an electronic device including the transmission line substrate.

2. Description of the Related Art

In the related art, a known transmission line substrate (flat cable) includes a base and multiple conductor patterns (a signal line, and a first ground conductor and a second ground conductor which sandwich the signal line in between) which are formed in the base.

For example, International Publication No. 2016/088592 discloses a transmission line substrate in which a first ground conductor is disposed on the mounting surface side, and in which a second ground conductor is disposed on the top surface side which is the opposite side of the mounting surface. In the transmission line substrate, only the second ground conductor on the top surface side has openings (conductor-non-formed portions) disposed so as to overlap the signal line in plan view. This configuration enables a circuit, having desired characteristics, to be formed even with a small space between the signal line and the second ground conductor, achieving a reduction in thickness (profile) of the transmission line substrate (base).

However, when the transmission line substrate, having the configuration described above, is incorporated in an electronic device (when the transmission line substrate is mounted on a circuit substrate), the second ground conductor, which is disposed on the top surface side and which has conductor-non-formed portions, causes the transmission line (signal line) to be susceptible to external noise.

SUMMARY OF THE INVENTION

Preferred embodiments of the present invention provide thin transmission line substrates, which each enable reduction or prevention of the effect of external noise even when a ground conductor has conductor-non-formed portions, and electronic devices each including such transmission line substrates.

A transmission line substrate according to a preferred embodiment of the present invention includes a line portion and at least one connection portion. The transmission line substrate includes a base, a first ground conductor, a second ground conductor, at least one signal line, and an input/output electrode. The base includes a first main surface and a second main surface. The first main surface is opposite the second main surface. The first ground conductor is on the first main surface side. The second ground conductor is on the second main surface side. The at least one signal line is in the base and extends in the transmission direction. The input/output electrode is on the first main surface side in the at least one connection portion and is connected to the at least one signal line. The at least one signal line in the line portion is between the first ground conductor and the second ground conductor in the thickness direction of the base. In the first ground conductor in the line portion, at least one first conductor-non-formed portion overlaps the at least one signal line in plan view. The at least one first conductor-non-formed portion is a portion in which a conductor is not present. In the second ground conductor in the line portion, at least one second conductor-non-formed portion overlaps the at least one signal line in plan view. The at least one second conductor-non-formed portion is a portion in which a conductor is not present. A total area of the at least one second conductor-non-formed portion is less than a total area of the at least one first conductor-non-formed portion.

A transmission line substrate according to a preferred embodiment of the present invention includes a line portion and at least one connection portion. The transmission line substrate includes a base, a first ground conductor, a second ground conductor, at least one signal line, and an input/output electrode. The base includes a first main surface and a second main surface. The first main surface is opposite the second main surface. The first ground conductor is on the first main surface side. The second ground conductor is on the second main surface side. The at least one signal line is in the base and extends in the transmission direction. The input/output electrode is on the first main surface side in the at least one connection portion and is connected to the at least one signal line. The at least one signal line in the line portion is between the first ground conductor and the second ground conductor in the thickness direction of the base. In the first ground conductor in the line portion, at least one first conductor-non-formed portion overlaps the at least one signal line in plan view. The at least one first conductor-non-formed portion is a portion in which a conductor is not present. In the second ground conductor in the line portion, a conductor-non-formed portion is not provided. The conductor-non-formed portion is a portion in which a conductor is not present.

According to the configurations described above, the first ground conductor, having a relatively low conductor ratio, is disposed on the mounting surface (first main surface) side, and the second ground conductor, having a relatively high conductor ratio, is disposed on the top surface (second main surface) side. Therefore, compared with the case in which the first ground conductor, having a relatively low conductor ratio, is positioned on the top surface side, the effect of external noise (especially, from the second main surface side) on the transmission line (signal line) is able to be reduced or prevented. This configuration also causes unwanted radio-frequency emission from the transmission line to be reduced or prevented.

According to the configurations described above, the at least one first conductor-non-formed portion is in the first ground conductor so as to overlap the signal line in plan view. Therefore, when a given circuit is provided on or in the transmission line substrate, the line width of the signal line may be made wide, and the conductor loss of the circuit may be reduced. When a circuit, having desired characteristics, is provided on or in the transmission line substrate, the base layer may be made thin without making the line width of the signal line narrow, so as to achieve a reduction in thickness (profile) of the transmission line substrate.

Preferred embodiments of the present invention each achieve a thin transmission line substrate, which each enable reduction or prevention of the effect of external noise even when a ground conductor includes conductor-non-formed portions, and electronic devices each including such transmission line substrates.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
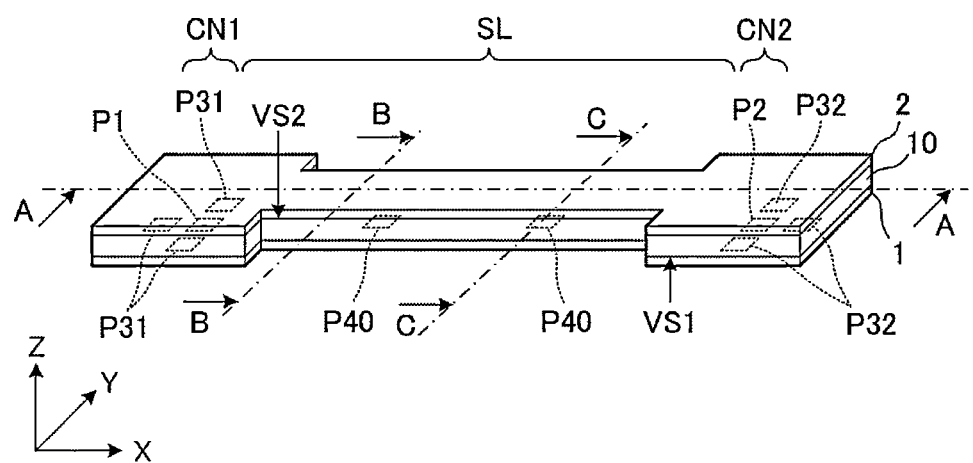
FIG. 1 is an external perspective view of a transmission line substrate 101 according to a first preferred embodiment of the present invention.

Preferred embodiments of the present invention will be described below by referring to examples with reference to the drawings. The same or corresponding components are designated with the same reference characters in the drawings. In consideration of ease of description or understanding of main points, the preferred embodiments are separately described for convenience sake. However, partial replacement or combination of configurations described in different preferred embodiments may be made. In a second preferred embodiment and subsequent preferred embodiments, points common to those in a first preferred embodiment will not be described. Only different points will be described. In particular, the same or substantially the same advantageous effects caused by the same or substantially the same configuration will not be described in the second preferred embodiment and subsequent preferred embodiments.

First Preferred Embodiment

Figure 2:
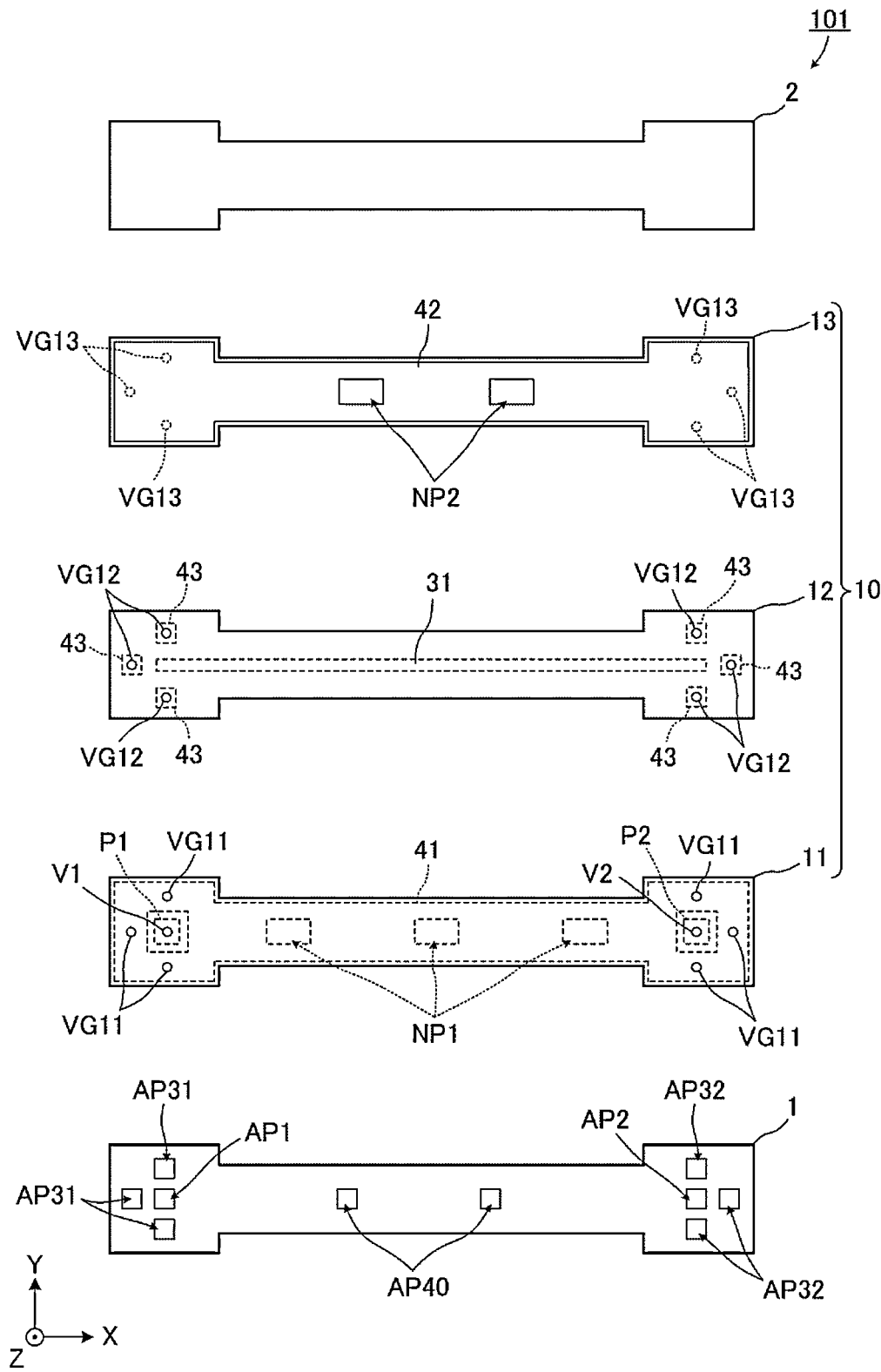
FIG. 2 is an exploded plan view of the transmission line substrate 101.
Figure 3:
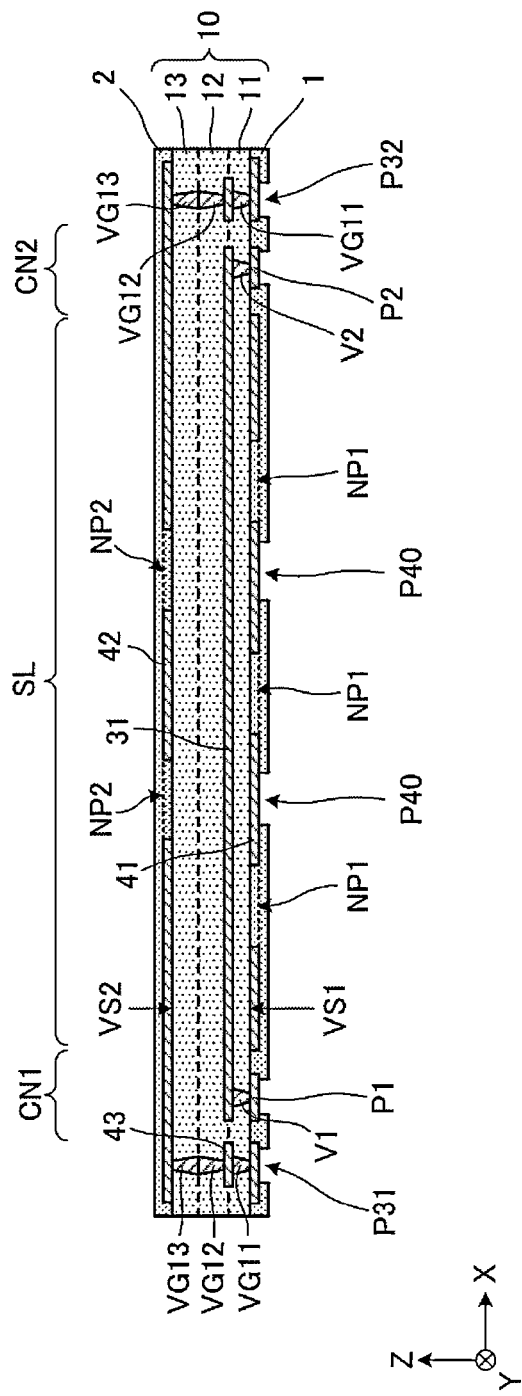
FIG. 3 is a cross-sectional view along A-A in FIG. 1.
Figure 4A:
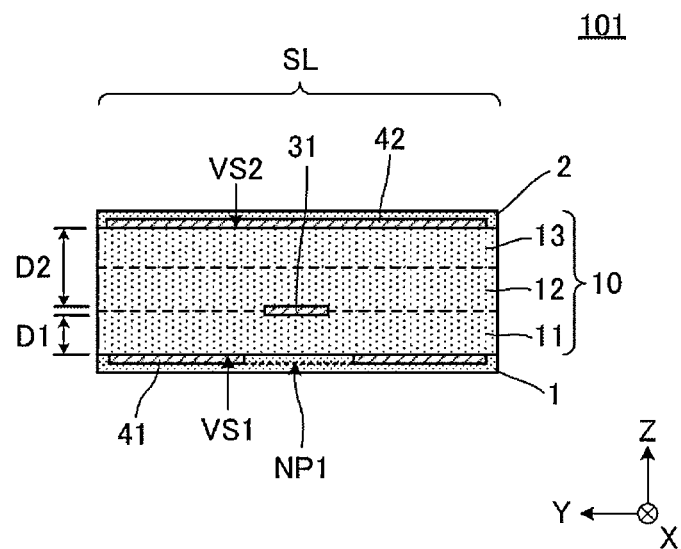
FIG. 4A is a cross-sectional view along B-B in FIG. 1.
Figure 4B:
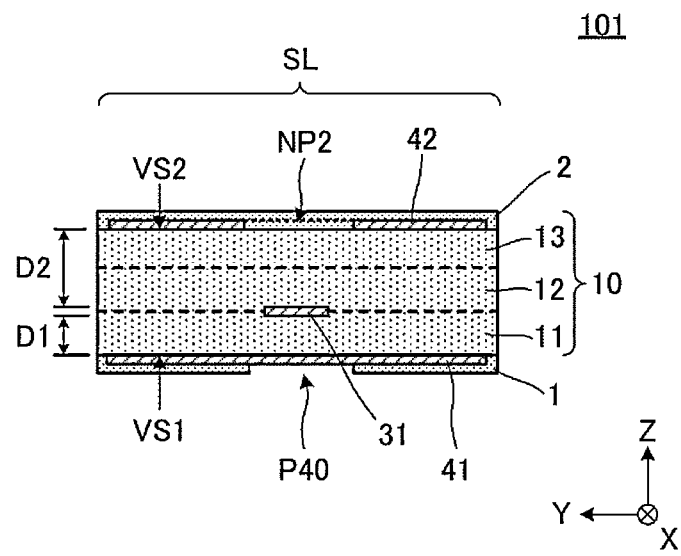
FIG. 4B is a cross-sectional view along C-C in FIG. 1.

FIG. 1 is an external perspective view of a transmission line substrate 101 according to a first preferred embodiment of the present invention. FIG. 2 is an exploded plan view of the transmission line substrate 101. FIG. 3 is a cross-sectional view along A-A in FIG. 1. FIG. 4A is a cross-sectional view along B-B in FIG. 1. FIG. 4B is a cross-sectional view along C-C in FIG. 1.

The transmission line substrate 101 according to the present preferred embodiment is, for example, a cable which connects electronic components, which are mounted on a single circuit substrate, or connects circuit substrates to each other.

The transmission line substrate 101 includes connection portions CN1 and CN2 and a line portion SL. The connection portions CN1 and CN2 are portions connected to different circuit substrates. As described in detail below, the line portion SL includes a transmission line (strip line) which connects the connection portions CN1 and CN2 to each other. In the transmission line substrate 101, the connection portion CN1, the line portion SL, and the connection portion CN2 are disposed in the +X direction in this sequence.

The transmission line substrate 101 includes a base 10, input/output electrodes P1 and P2, multiple ground electrodes P31, multiple ground electrodes P32, multiple auxiliary electrodes P40, conductor patterns (a signal line 31, a first ground conductor 41, a second ground conductor 42, and multiple intermediate ground conductors 43), interlayer connection conductors V1, V2, VG11, VG12, and VG13, a first protective layer 1, and a second protective layer 2.

The base 10, which is a rectangular or substantially rectangular flat plate whose longitudinal direction matches the X axis direction, includes a first main surface VS1 and a second main surface VS2 which are opposite each other. The first main surface VS1 and the second main surface VS2 are parallel or substantially parallel to the XY plane. The input/output electrode P1 and the ground electrodes P31 are provided on the first main surface VS1 side in the connection portion CN1. The input/output electrode P2 and the ground electrodes P32 are provided on the first main surface VS1 side in the connection portion CN2. The auxiliary electrodes P40 are provided on the first main surface VS1 side in the line portion SL. The first ground conductor 41 and the first protective layer 1 are provided on the first main surface VS1. The second ground conductor 42 and the second protective layer 2 are provided on the second main surface VS2. The signal line 31, the intermediate ground conductors 43, the interlayer connection conductors V1 and V2, the interlayer connection conductors VG11, the interlayer connection conductors VG12, and the interlayer connection conductors VG13 are provided inside the base 10.

The base 10 includes multiple base layers 11, 12, and 13 which are stacked in this sequence. The base layers 11 to 13 are rectangular or substantially rectangular resin (for example, thermoplastic resin) flat plates whose longitudinal direction matches the X axis direction, and each have flexibility. The base layers 11 to 13 are, for example, sheets including a base material of liquid crystal polymer (LCP) or polyether ether ketone (PEEK).

The input/output electrodes P1 and P2 and the first ground conductor 41 are provided on the back surface of the base layer 11. The input/output electrode P1 is a rectangular or substantially rectangular conductor pattern disposed near a first end, in the longitudinal direction, of the base layer 11 (the left end of the base layer 11 in FIG. 2). The input/output electrode P2 is a rectangular or substantially rectangular conductor pattern disposed near a second end, in the longitudinal direction, of the base layer 11 (the right end of the base layer 11 in FIG. 2). The first ground conductor 41 is a conductor pattern provided on the entire or substantially the entire surface of the base layer 11. The first ground conductor 41 includes three first conductor-non-formed portions NP1. The first conductor-non-formed portions NP1 are rectangular or substantially rectangular openings (portions without the conductor). The three first conductor-non-formed portions NP1 are arranged in the X axis direction. The input/output electrodes P1 and P2 and the first ground conductor 41 are conductor patterns, for example, of Cu foil. The interlayer connection conductors V1 and V2 and the interlayer connection conductors VG11 are provided in the base layer 11.

The signal line 31 and the intermediate ground conductors 43 are provided on the back surface of the base layer 12. The signal line 31 is a linear conductor pattern which extends in the transmission direction (X axis direction). The intermediate ground conductors 43 are rectangular or substantially rectangular conductor patterns disposed near both the ends, in the longitudinal direction, of the base layer 12. Specifically, three intermediate ground conductors 43 are disposed near a first end, in the longitudinal direction, of the base layer 12 (the left end of the base layer 12 in FIG. 2). Three intermediate ground conductors 43 are disposed near a second end, in the longitudinal direction, of the base layer 12 (the right end of the base layer 12 in FIG. 2). The signal line 31 and the intermediate ground conductors 43 are conductor patterns, for example, of Cu foil. The interlayer connection conductors VG12 are provided in the base layer 12.

The second ground conductor 42 is provided on the front surface of the base layer 13. The second ground conductor 42 is a conductor pattern provided on the entire or substantially the entire surface of the base layer 13. The second ground conductor 42 includes two second conductor-non-formed portions NP2. The second conductor-non-formed portions NP2 are rectangular or substantially rectangular openings (portions without the conductor). The two second conductor-non-formed portions NP2 are arranged in the X axis direction. The second ground conductor 42 is a conductor pattern, for example, of Cu foil. The interlayer connection conductors VG13 are provided in the base layer 13.

The first protective layer 1 is a protective film provided on the back surface of the base layer 11 (the first main surface of the base 10). The first protective layer 1 has the same or substantially the same planar shape as that of the base layer 11. The first protective layer 1 is, for example, a cover lay film, a solder resist film, or an epoxy resin film.

The first protective layer 1 has rectangular or substantially rectangular cavities AP1 and AP2, multiple rectangular or substantially rectangular cavities AP31, multiple rectangular or substantially rectangular cavities AP32, and multiple rectangular or substantially rectangular cavities AP40. The cavity AP1 and the cavities AP31 are disposed near a first end of the first protective layer 1 (the left end of the first protective layer 1 in FIG. 2). The cavity AP2 and the cavities AP32 are disposed near a second end of the first protective layer 1 (the right end of the first protective layer 1 in FIG. 2). The cavities AP40 are disposed in a central area, in the longitudinal direction, of the first protective layer 1, and are arranged in the X axis direction.

The cavity AP1 is provided at a position corresponding to the position of the input/output electrode P1. The cavity AP2 is provided at a position corresponding to the position of the input/output electrode P2. Therefore, even when the first protective layer 1 is provided on the back surface of the base layer 11, the input/output electrode P1 is exposed to the outside through the cavity AP1, and the input/output electrode P2 is exposed to the outside through the cavity AP2. The cavities AP31, AP32, and AP40 are provided at positions corresponding to the position of the first ground conductor 41. Therefore, even when the first protective layer 1 is provided on the back surface of the base layer 11, portions of the first ground conductor 41 are exposed to the outside through the cavities AP31, AP32, and AP40. In the present preferred embodiment, portions of the first ground conductor 41 exposed through the cavities AP31 are the ground electrodes P31. Portions of the first ground conductor 41 exposed through the cavities AP32 are the ground electrodes P32. Portions of the first ground conductor 41 exposed through the cavities AP40 are the auxiliary electrodes P40.

The second protective layer 2 is a protective film provided on the front surface of the base layer 13 (the second main surface VS2 of the base 10). The second protective layer 2 has the same or substantially the same planar shape as that of the base layer 13. The second protective layer 2 is, for example, a cover lay film, a solder resist film, or an epoxy resin film.

The input/output electrodes P1 and P2 are electrically coupled to the signal line 31. Specifically, as illustrated, for example, in FIG. 3, the signal line 31 is connected, at its first end, to the input/output electrode P1 through the interlayer connection conductor V1, and is connected, at its second end, to the input/output electrode P2 through the interlayer connection conductor V2. The first ground conductor 41 and the second ground conductor 42 are electrically coupled to each other through the intermediate ground conductors 43 and the interlayer connection conductors VG11, VG12, and VG13.

As illustrated in FIGS. 4A and 4B, the signal line 31 in the line portion SL is disposed between the first ground conductor 41 and the second ground conductor 42 in the Z axis direction. A transmission line (strip line), including the signal line 31, the first ground conductor 41, and the second ground conductor 42, is provided in the line portion SL of the transmission line substrate 101. The distance D1 between the signal line 31 and the first ground conductor 41 in the Z axis direction is less than the distance D2 between the signal line 31 and the second ground conductor 42 in the Z axis direction (D1<D2).

As illustrated, for example, in FIG. 2 and FIG. 4A, the first conductor-non-formed portions NP1 overlap the signal line 31 in plan view of the first main surface VS1 and the second main surface VS2 (viewed in the Z axis direction). As illustrated, for example, in FIG. 2 and FIG. 4B, the second conductor-non-formed portions NP2 overlap the signal line 31 when viewed in the Z axis direction. The width of each first conductor-non-formed portion NP1 (the width in the Y axis direction) is larger than the line width of the signal line 31 (the width in the Y axis direction), and the width of each second conductor-non-formed portion NP2 is larger than the line width of the signal line 31. The total area of the second conductor-non-formed portions NP2 is smaller than the total area of the first conductor-non-formed portions NP1.

The first protective layer 1 and the second protective layer 2 according to the present preferred embodiment are made of a material having a relative permittivity higher than that of the base 10 (the base layers 11 to 13). As illustrated in FIG. 4A, the first protective layer 1 covers the first conductor-non-formed portions NP1 when viewed in the Z axis direction. As illustrated in FIG. 4B, the second protective layer 2 covers the second conductor-non-formed portions NP2 when viewed in the Z axis direction.

Figure 5:
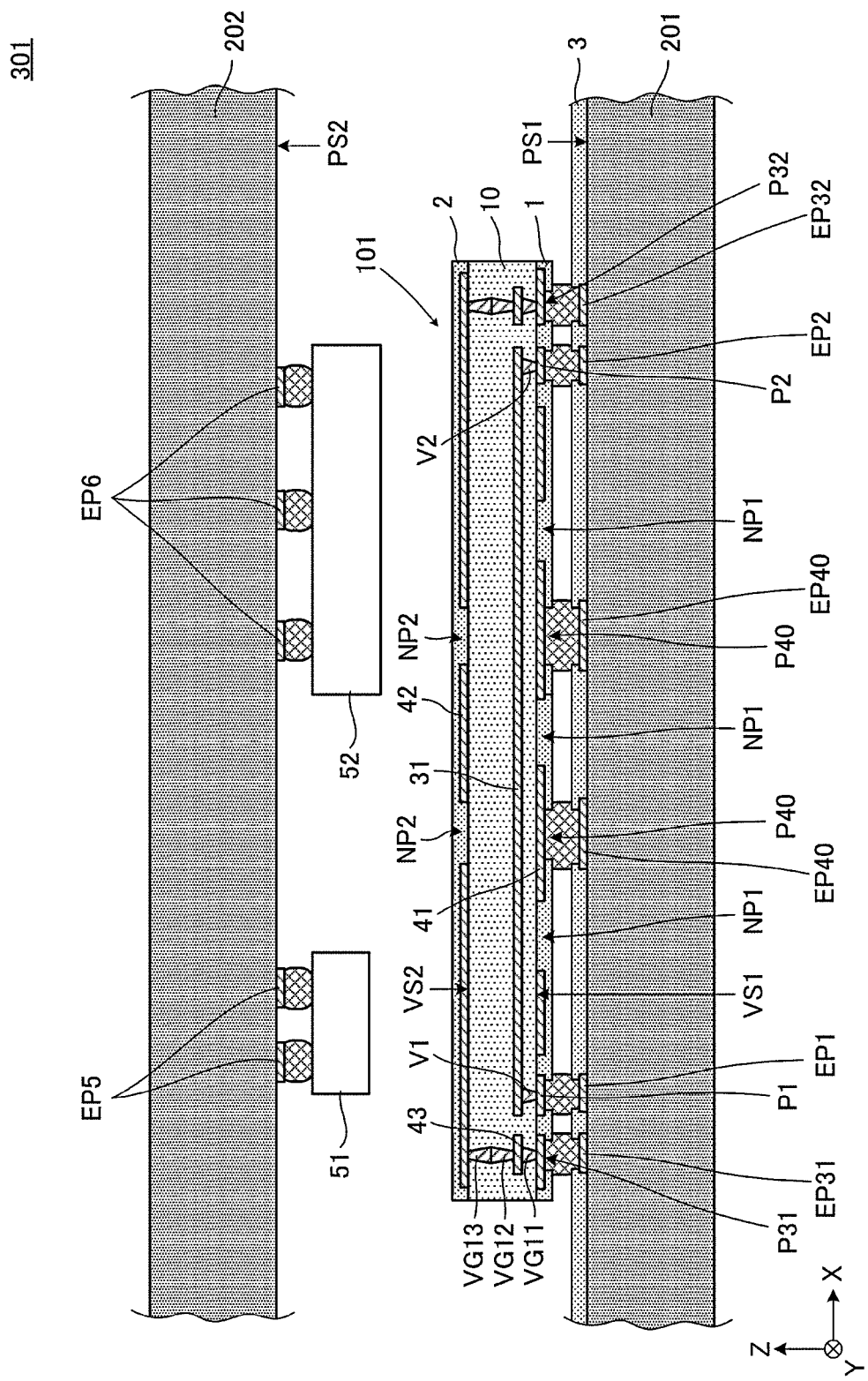
FIG. 5 is a cross-sectional view of a principal portion of an electronic device 301 according to the first preferred embodiment of the present invention.

The transmission line substrate 101 is used, for example, as described below. FIG. 5 is a cross-sectional view of a principal portion of an electronic device 301 according to the first preferred embodiment.

The electronic device 301 includes the transmission line substrate 101, circuit substrates 201 and 202, and active devices 51 and 52. The electronic device 301 includes other devices which are not illustrated in FIG. 5. The circuit substrates 201 and 202 are, for example, glass/epoxy substrates. The active devices 51 and 52 are, for example, semiconductor devices and ICs.

As illustrated in FIG. 5, the circuit substrate 201 is opposite to the circuit substrate 202. Specifically, a first surface PS1 of the circuit substrate 201 is opposite to a second surface PS2 of the circuit substrate 202. Substrate-side electrodes EP1, EP2, EP31, EP32, and EP40 and a protective layer 3 are disposed on the first surface PS1 of the circuit substrate 201. Multiple substrate-side electrodes EP5 and multiple substrate-side electrodes EP6 are disposed on the second surface PS2 of the circuit substrate 202. The protective layer 3 has a relative permittivity higher than that of the base 10 (or the base of the circuit substrate 201). The protective layer 3 is, for example, a cover lay film, a solder resist film, or an epoxy resin.

The transmission line substrate 101 is surface mounted on the circuit substrate 201 so that the first main surface VS1 is opposite to the first surface PS1 of the circuit substrate 201. Specifically, the input/output electrodes P1 and P2 of the transmission line substrate 101 are joined to the substrate-side electrodes EP1 and EP2, respectively, of the circuit substrate 201 with a conductive jointing material, such as, for example, solder interposed in between. The other electrodes (the ground electrodes P31 and P32 and the auxiliary electrodes P40) of the transmission line substrate 101 are joined to the substrate-side electrodes EP31, EP32, and EP40, respectively, of the circuit substrate 201 with a conductive jointing material interposed in between.

The active devices 51 and 52 are mounted on the second surface PS2 of the circuit substrate 202. Specifically, the input/output terminals of the active device 51 are joined to the substrate-side electrodes EP5 of the circuit substrate 202. The input/output terminals of the active device 52 are connected to the substrate-side electrodes EP6 of the circuit substrate 202. As illustrated in FIG. 5, the active devices 51 and 52 are disposed closer to the second main surface VS2 than to the first main surface VS1 in the line portion SL.

The transmission line substrate 101 and the electronic device 301 according to the present preferred embodiment have the following advantageous effects.

(a) In the present preferred embodiment, the total area of the second conductor-non-formed portions NP2 of the second ground conductor 42 positioned on the top surface (second main surface VS2) side is less than the total area of the first conductor-non-formed portions NP1 of the first ground conductor 41 positioned on the mounting surface (first main surface VS1) side. That is, in the transmission line substrate 101 according to the present preferred embodiment, the first ground conductor 41, having a relatively low conductor ratio, is disposed on the mounting surface, and the second ground conductor 42, having a relatively high conductor ratio, is disposed on the top surface side. This configuration enables reduction or prevention of the effects of external noise (especially, from the second main surface VS2 side) on the transmission line (signal line 31), compared with the case in which a first ground conductor, having a relatively low conductor ratio, is positioned on the top surface side. This configuration also causes reduction or prevention of unwanted radio-frequency emission from the transmission line.

(b) The configuration described above provides the electronic device 301 including the thin transmission line substrate 101 which reduces or prevents the effects of external noise, compared with the case in which a ground conductor, having a relatively larger total area of conductor-non-formed portions, is disposed on the top surface side (the case in which the second main surface VS2 serves as the mounting surface and in which the first main surface VS1 serves as the top surface).

(c) In the present preferred embodiment, the first conductor-non-formed portions NP1 are provided in the first ground conductor 41 so as to overlap the signal line 31 when viewed in the Z axis direction. In the present preferred embodiment, the second conductor-non-formed portions NP2 are provided in the second ground conductor 42 so as to overlap the signal line 31 when viewed in the Z axis direction. This configuration enables the line width of the signal line 31 to be made large when a desired circuit is provided on or in the transmission line substrate, and enables a reduction of the conductor loss of the circuit. When a circuit, having desired characteristics, is provided on or in the transmission line substrate, this configuration also enables the base layer to be made thin without making the line width of the signal line 31 narrow, thus achieving a thin (low-profile) transmission line substrate.

(d) In the present preferred embodiment, the transmission line substrate 101 is surface mounted on the circuit substrate 201. Thus, the entire transmission line substrate 101 is fixed to the circuit substrate 201. According to this configuration, compared with the case in which a transmission line substrate is connected to a circuit substrate, for example, by using connectors, the distance between the conductor patterns in the transmission line substrate 101 and the conductors included in the circuit in the circuit substrate 201 is hardly changed, thus enabling the characteristics of the circuit to hardly change.

(e) In the present preferred embodiment, the first protective layer 1, having a relative permittivity higher than that of the base 10, is provided on the first main surface VS1. This configuration enables reduction or prevention of unwanted emission from the first conductor-non-formed portions NP1 to the first main surface VS1 side (the outside, the circuit substrate 201 side) and reduction or prevention of unwanted emission from the first main surface VS1 side. In particular, as in the present preferred embodiment, the first protective layer 1, which covers the first conductor-non-formed portions NP1 when viewed in the Z axis direction, improves the advantageous effects of reduction or prevention of the unwanted emission. In the present preferred embodiment, the relative permittivity of the protective layer 3 provided on the first surface PS1 of the circuit substrate 201 is higher than that of the base 10 (or the base of the circuit substrate 201). Thus, the unwanted emission from the circuit substrate 201 (or the unwanted emission to the circuit substrate 201) is further reduced or prevented.

(f) In the electronic device 301 according to the present preferred embodiment, the active devices 51 and 52, which easily generate noise, are positioned on the second main surface VS2 (the top surface of the transmission line substrate 101) side. However, the area of the conductor-non-formed portions of the second ground conductor 42 positioned on the second main surface VS2 side is relatively small. Thus, compared with the case in which the area of the conductor-non-formed portions of a ground conductor positioned on the second main surface VS2 side is large, it is unlikely to be adversely affected by noise from the active devices 51 and 52.

(g) In the present preferred embodiment, the second protective layer 2, having a relative permittivity higher than that of the base 10, is provided on the second main surface VS2. This configuration enables reduction or prevention of unwanted emission from the second conductor-non-formed portions NP2 to the second main surface VS2 side (the outside) and reduction or prevention of unwanted emission from the second main surface VS2 side. In particular, the second protective layer 2, which covers the second conductor-non-formed portions NP2 as in the present preferred embodiment when viewed in the Z axis direction, further improves the advantageous effects of reduction or prevention of the unwanted emission.

(h) In the present preferred embodiment, the first conductor-non-formed portions NP1 do not overlap the second conductor-non-formed portions NP2 when viewed in the Z axis direction. This configuration enables reduction or prevention of a rapid change of the characteristic impedance in the line portion SL (transmission line). That is, the continuity of the characteristic impedance in the line portion SL is easy to maintain.

(i) In the present preferred embodiment, the auxiliary electrodes P40 are disposed between the connection portions CN1 and CN2 when viewed in the Z axis direction. This configuration reduces or prevents a misalignment of the line portion SL from occurring due to the self-alignment function of a conductive jointing material which joins the auxiliary electrodes P40 to the substrate-side electrodes EP40. In the present preferred embodiment, the auxiliary electrodes P40 are disposed in the transmission direction. Thus, even when the portion between the connection portions CN1 and CN2 (the line portion SL) extends a large distance, that is, even when the portion has a shape that is easy to change, while the shape of the transmission line substrate 101 (especially, the line portion SL) is maintained, the transmission line substrate 101 may be mounted on the circuit substrate 201 with high accuracy.

The "connection portion" refers to a portion which connects, for example, an input/output electrode of a transmission line substrate to a different substrate (such as a different circuit substrate or a different transmission line substrate) and which transmits signals to the different substrate. Specifically, the "connection portion" refers to a cavity for a ground conductor when viewed in the Z axis direction (a cavity in which an input/output electrode connected to a signal line is disposed). The "line portion" refers to an area other than connection portions when both the ends in the transmission direction (the direction along the signal line) define and function as the connection portions. The "connection portion" may be, for example, solder mounted on an external circuit substrate directly, or may be a connector. Thus, the "connection portion" has a width wider than that of the line portion.

The "second ground conductor" is supposed to overlie the "first ground conductor" when viewed in the Z axis direction (the stacking direction or the thickness direction). That is, the "first conductor-non-formed portion" refers to a portion which is overlain by the second ground conductor when viewed in the Z axis direction and in which the first ground conductor is not present. The "second conductor-non-formed portion" refers to a portion which overlies the first ground conductor when viewed in the Z axis direction and in which the second ground conductor is not present.

The present preferred embodiment describes the electronic device 301 in which the active devices 51 and 52 are closer to the second main surface VS2 than to the first main surface VS1 in the line portion SL. However, this configuration is not limited thereto. For example, even when an antenna or a conductor for a different circuit is closer to the second main surface VS2 than to the first main surface VS1 in the line portion SL, the same or substantially the same operation/advantageous effects are provided.

The transmission line substrate 101 according to the present preferred embodiment is manufactured, for example, in the following process.

(1) The base layers 11, 12, and 13 are prepared. The base layers 11 to 13 are sheets whose main material is, for example, a thermoplastic resin, such as liquid crystal polymer (LCP) or polyether ether ketone (PEEK).

(2) The input/output electrodes P1 and P2 and the conductor patterns (the signal line 31, the first ground conductor 41, the second ground conductor 42, and the intermediate ground conductors 43) are formed on the base layers 11 to 13. Specifically, metallic foil (for example, Cu foil) is laminated on one surface of each of the base layers 11 to 13, and the metallic foil sheets are patterned through photolithography. Thus, the input/output electrodes P1 and P2 and the first ground conductor 41 are formed on the back surface of the base layer 11, the signal line 31 and the intermediate ground conductors 43 are formed on the back surface of the base layer 12; the second ground conductor 42 is formed on the front surface of the base layer 13.

The first conductor-non-formed portions NP1 are disposed at desired positions of the first ground conductor 41. The second conductor-non-formed portions NP2 are disposed at desired positions of the second ground conductor 42. The total area of the second conductor-non-formed portions NP2 is less than the total area of the first conductor-non-formed portions NP1.

(3) The interlayer connection conductors V1 and V2, the interlayer connection conductors VG11, the interlayer connection conductors VG12, and the interlayer connection conductors VG13 are formed in the base layers 11 to 13. These interlayer connection conductors are formed as follows: holes (through-holes) are disposed in the base layers 11 to 13, a conductive paste, which includes metal powder, such as, for example, Cu and Sn or an alloy of these, and a resin material, is filled in the holes (the holes are filled with the conductive paste), the conductive paste is hardened through heat pressing which is performed later.

(4) The base layers 11, 12, and 13 are stacked (placed) in this sequence. The base layers 11 to 13 thus stacked are heat-pressed (collectively pressed) to form the base 10. When the base layers 11 to 13 are stacked, the signal line 31 is disposed between the first ground conductor 41 and the second ground conductor 42 in the Z axis direction. The first conductor-non-formed portions NP1 and the second conductor-non-formed portions NP2 overlap the signal line 31 when viewed in the Z axis direction.

(5) After that, the first protective layer 1 is formed on the first main surface VS1 of the base 10 (the back surface of the base layer 11). The second protective layer 2 is formed on the second main surface VS2 of the base 10 (the front surface of the base layer 13). Thus, the transmission line substrate 101 is obtained. The first protective layer 1 and the second protective layer 2 are formed, for example, of cover lay film, solder resist film, or epoxy resin.

According to this example manufacture method, even in the configuration in which conductor-non-formed portions are disposed in a ground conductor, a thin transmission line substrate, which enables reduction or prevention of the effect of external noise, may be easily manufactured.

According to the example manufacture method described above, the base layers 11 to 13 whose main material is, for example, thermoplastic resin are stacked and heat-pressed (collectively pressed). Thus, the base 10 may be easily formed, thus achieving a reduction in the manufacture process and a reduction in cost.

According to the example manufacture method described above, a conductive paste is filled in the holes disposed in the base layer, and the conductive paste is hardened through heat pressing (collective pressing). Thus, a process for forming interlayer connection conductors may be eliminated.

Second Preferred Embodiment

A second preferred embodiment of the present invention describes an exemplary transmission line substrate in which conductor-non-formed portions are not disposed in the second ground conductor.

Figure 6:
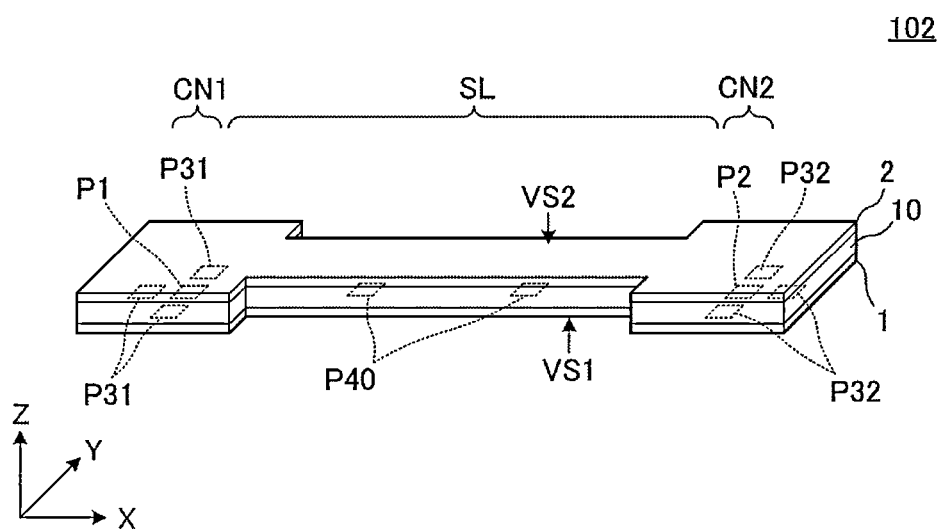
FIG. 6 is an external perspective view of a transmission line substrate 102 according to a second preferred embodiment of the present invention.
Figure 7:
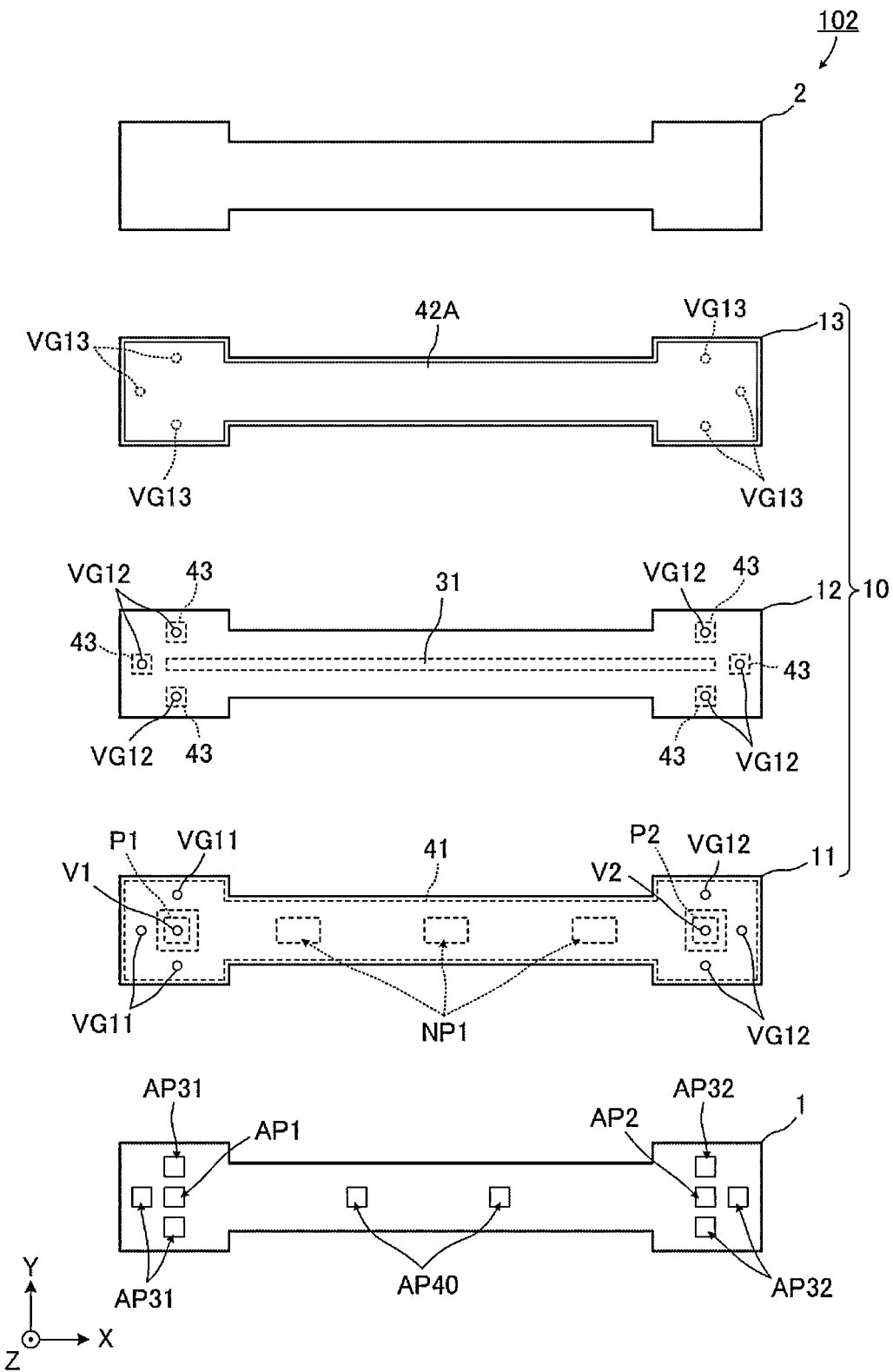
FIG. 7 is an exploded plan view of the transmission line substrate 102.

FIG. 6 is an external perspective view of a transmission line substrate 102 according to the second preferred embodiment. FIG. 7 is an exploded plan view of the transmission line substrate 102.

The transmission line substrate 102 is different from the transmission line substrate 101 according to the first preferred embodiment in that a second ground conductor 42A, which is solid and in which conductor-non-formed portions are not disposed, is included. The remaining configuration of the transmission line substrate 102 is the same or substantially the same as that of the transmission line substrate 101.

In the transmission line substrate 102 according to the present preferred embodiment, the second ground conductor 42A is a solid conductor pattern. This configuration improves the shield effect, against the electromagnetic field, of the line portion SL, compared with a transmission line substrate including a second ground conductor in which conductor-non-formed portions are disposed (see the transmission line substrate 101 according to the first preferred embodiment).

Third Preferred Embodiment

A third preferred embodiment of the present invention describes an exemplary transmission line substrate including multiple signal lines.

Figure 8A:
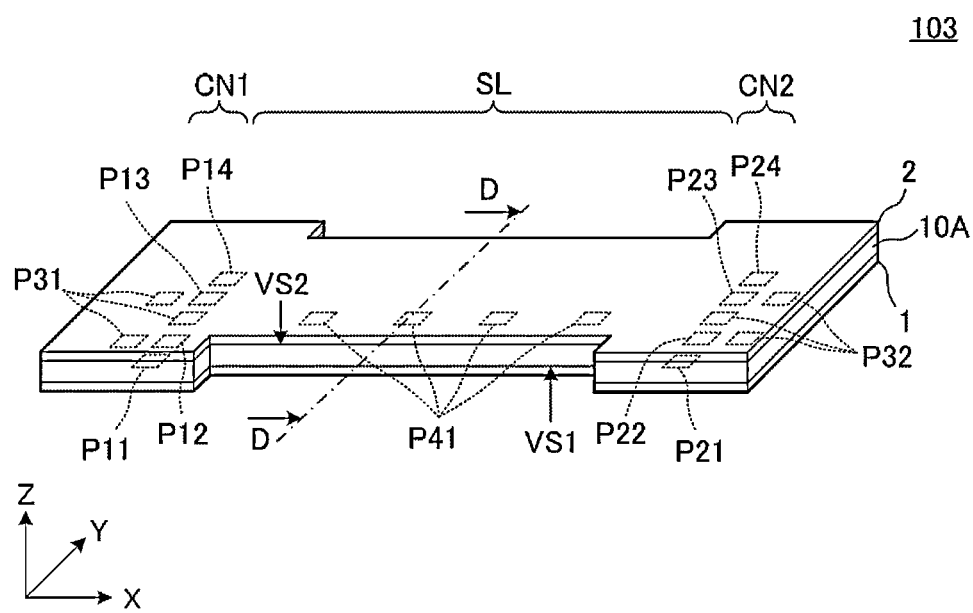
FIG. 8A is an external perspective view of a transmission line substrate 103 according to a third preferred embodiment of the present invention.
Figure 8B:
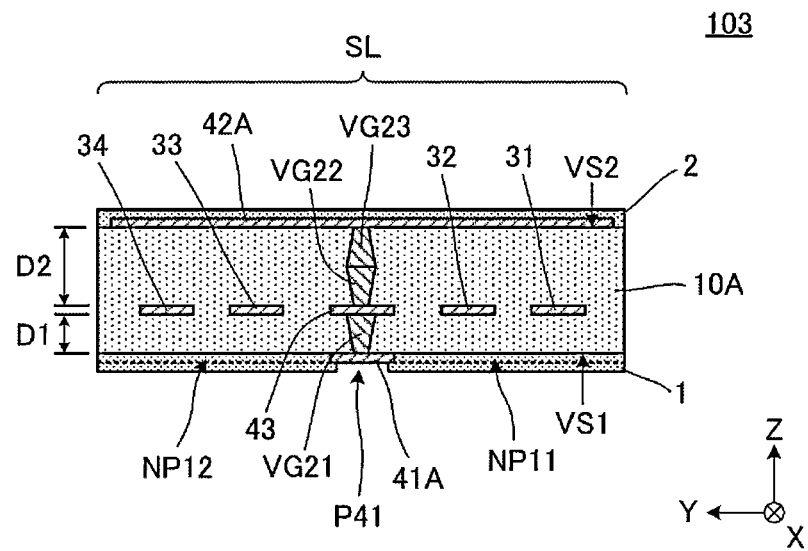
FIG. 8B is a cross-sectional view along D-D in FIG. 8A.

FIG. 8A is an external perspective view of a transmission line substrate 103 according to the third preferred embodiment. FIG. 8B is a cross-sectional view along D-D in FIG. 8A.

The transmission line substrate 103 is different from the transmission line substrate 101 according to the first preferred embodiment in that a base 10A, input/output electrodes P11, P12, P13, P14, P21, P22, P23, and P24, multiple signal lines 31, 32, 33, and 34, a first ground conductor 41A, the second ground conductor 42A, four auxiliary electrodes P41, multiple interlayer connection conductors VG21, multiple interlayer connection conductors VG22, and multiple interlayer connection conductors VG23 are included. The remaining configuration of the transmission line substrate 103 is the same or substantially the same as that of the transmission line substrate 101.

Portions different from those of the transmission line substrate 101 according to the first preferred embodiment will be described below.

The base 10A has a width, in the width direction (Y axis direction), wider than that of the base 10, which is described in the first preferred embodiment. The remaining configuration of the base 10A is the same or substantially the same as that of the base 10.

The input/output electrodes P11 to P14 and the three ground electrodes P31 are provided on the first main surface VS1 side in the connection portion CN1. The input/output electrodes P21 to P24 and the three ground electrodes P32 are provided on the first main surface VS1 side in the connection portion CN2. The four auxiliary electrodes P41 are provided on the first main surface VS1 side in the line portion SL. The signal lines 31 to 34, the first ground conductor 41A, the second ground conductor 42A, the intermediate ground conductors 43, and the interlayer connection conductors VG21, VG22, and VG23 are provided inside the line portion SL (base 10A).

The signal lines 31 to 34 are linear conductor patterns which extend in the transmission direction (X axis direction). The signal lines 31 to 34 include portions which extend in parallel or substantially in parallel to each other in the line portion SL. The signal lines 31, 32, 33, and 34 are arranged in the +Y direction in this sequence. In the present preferred embodiment, the signal lines 31 to 34 are disposed in the same layer in the Z axis direction (the stacking direction or the thickness direction). The first ground conductor 41A is different from the first ground conductor 41 described in the first preferred embodiment in that first conductor-non-formed portions NP11 and NP12 are provided. The first conductor-non-formed portions NP11 and NP12 are long openings (recesses) which extend in the X axis direction, and are provided in outer portions of the first ground conductor 41A. The first conductor-non-formed portions NP11 and NP12 are arranged in the +Y direction in this sequence. Specifically, the first ground conductor 41A is a linear conductor pattern which extends in the transmission direction.

The second ground conductor 42A is different from the second ground conductor 42 described in the first preferred embodiment in that conductor-non-formed portions are not provided. The remaining configuration of the second ground conductor 42A is the same or substantially the same as that of the second ground conductor 42.

The four auxiliary electrodes P41 are disposed in the respective central areas in the width direction (Y axis direction) in the line portion SL, and are arranged in the transmission direction (X axis direction). The multiple sets of interlayer connection conductors VG21 to VG23 are disposed in the respective central areas in the width direction in the line portion SL. The multiple sets of interlayer connection conductors VG21 to VG23 are arranged in the transmission direction (X axis direction) (not illustrated).

The input/output electrodes P11 and P21 are electrically coupled to the signal line 31, the input/output electrodes P12 and P22 are electrically coupled to the signal line 32, the input/output electrodes P13 and P23 are electrically coupled to the signal line 33, the input/output electrodes P14 and P24 are electrically coupled to the signal line 34 (not illustrated). The first ground conductor 41A and the second ground conductor 42A are electrically coupled to each other through the intermediate ground conductors 43 and the interlayer connection conductors VG21, VG22, and VG23 in the line portion SL.

As illustrated in FIG. 8B, the signal lines 31 to 34 in the line portion SL are disposed between the first ground conductor 41A and the second ground conductor 42A in the Z axis direction. A transmission line (microstrip line), which includes the signal lines 31 to 34 and the second ground conductor 42A, is provided in the line portion SL of the transmission line substrate 102. The distance D1 between the signal lines 31 to 34 and the first ground conductor 41A in the Z axis direction is less than the distance D2 between the signal lines 31 to 34 and the second ground conductor 42A in the Z axis direction (D1<D2).

In the present preferred embodiment, as illustrated in FIG. 8B, the grounds (the intermediate ground conductors 43 and the interlayer connection conductors VG21 to VG23) are disposed between the signal lines 31 and 32 and the signal lines 33 and 34. This configuration achieves isolation between the signal lines 31 and 32 and the signal lines 33 and 34, resulting in reduction or prevention of the cross talk.

Further, in the present preferred embodiment, the four auxiliary electrodes P41 are spaced evenly in the transmission direction. Even when the line portion SL (between the connection portions CN1 and CN2) extends a long distance, this configuration enables reduction or prevention of abnormal movement of the line portion SL with respect to a circuit substrate in a joining operation using a reflow soldering method or the like.

The present preferred embodiment describes the example in which the signal lines 31 to 34 are disposed in the same layer in the Z axis direction. However, this configuration is not limited thereto. The signal lines may be disposed in corresponding different layers in the Z axis direction.

Fourth Preferred Embodiment

A fourth preferred embodiment of the present invention describes an exemplary transmission line substrate in which auxiliary electrodes each extend across the first main surface, a side surface, and the second main surface of the base.

Figure 9A:
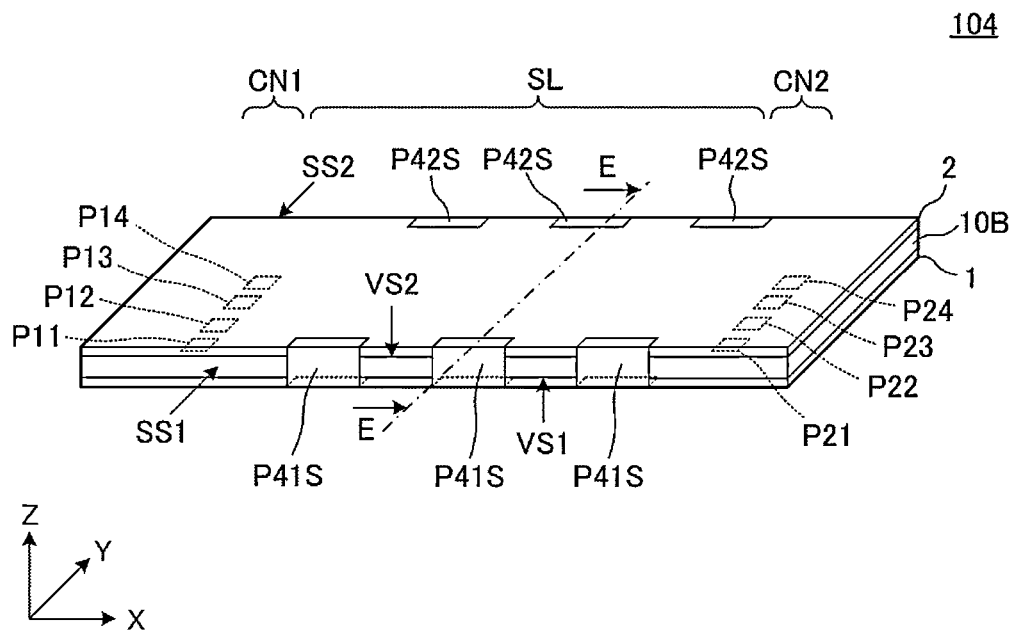
FIG. 9A is an external perspective view of a transmission line substrate 104 according to a fourth preferred embodiment of the present invention.
Figure 9B:
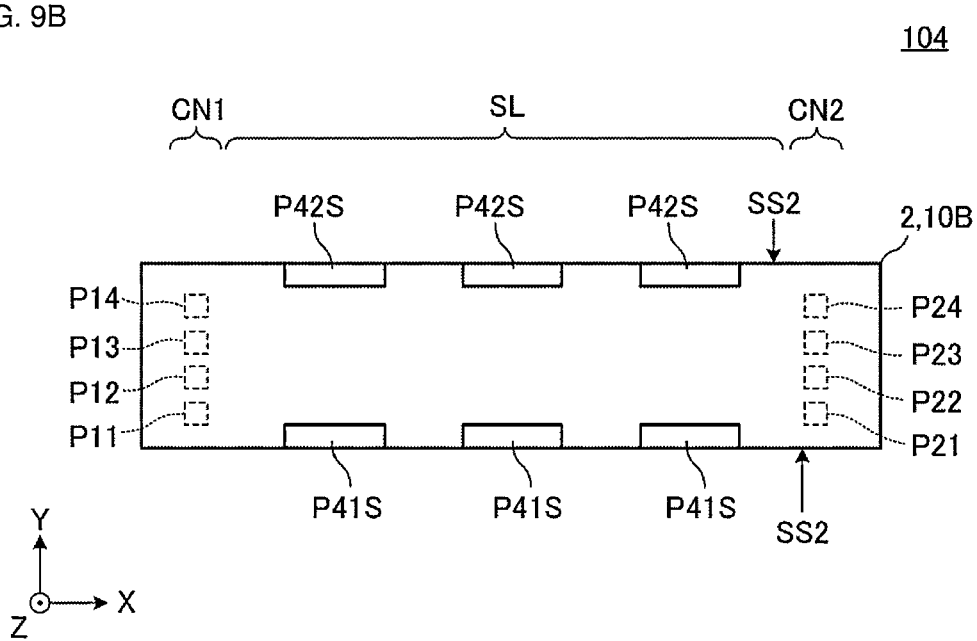
FIG. 9B is a plan view of the transmission line substrate 104.
Figure 10:
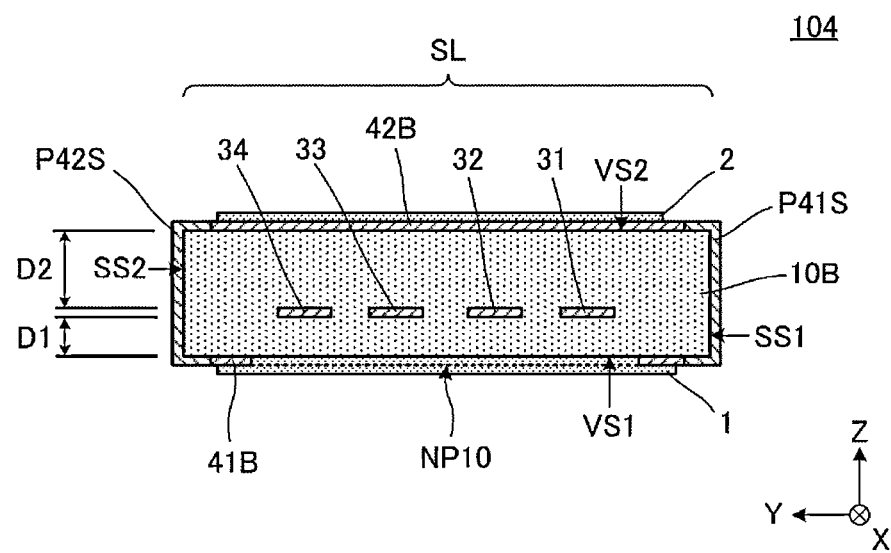
FIG. 10 is a cross-sectional view along E-E in FIG. 9A.

FIG. 9A is an external perspective view of a transmission line substrate 104 according to the fourth preferred embodiment. FIG. 9B is a plan view of the transmission line substrate 104. FIG. 10 is a cross-sectional view along E-E in FIG. 9A.

The transmission line substrate 104 is different from the transmission line substrate 104 according to the first preferred embodiment in that a base 10B, the input/output electrodes P11, P12, P13, P14, P21, P22, P23, and P24, the signal lines 31, 32, 33, and 34, a first ground conductor 41B, a second ground conductor 42B, multiple auxiliary electrodes P41S, and multiple auxiliary electrodes P42S are included.

Portions different from those of the transmission line substrate 101 according to the first preferred embodiment will be described below.

The base 10B is a rectangular or substantially rectangular flat plate whose longitudinal direction matches the X axis direction. The base 10B includes the first main surface VS1, the second main surface VS2, and side surfaces SS1 and SS2. The side surfaces SS1 and SS2 are parallel or substantially parallel to the XZ plane and are adjacent to the first main surface VS1 and the second main surface VS2. The remaining configuration of the base 10B is the same or substantially the same as that of the base 10 described in the first preferred embodiment.

The input/output electrodes P11 to P14 are provided on the first main surface VS1 side in the connection portion CN1. The input/output electrodes P21 to P24 are provided on the first main surface VS1 side in the connection portion CN2. The signal lines 31 to 34 are provided inside the base 10B.

The auxiliary electrodes P41S extend across the first main surface VS1, the side surface SS1, and the second main surface VS2. The auxiliary electrodes P42S extend across the first main surface VS1, the side surface SS2, and the second main surface VS2. The three auxiliary electrodes P41S are arranged in the +X direction, and the three auxiliary electrodes P42S are arranged in the +X direction. The auxiliary electrodes P41S and P42S are, for example, plating films of Cu or the like which are formed on the side surfaces SS1 and SS2 by electroless plating or the like. The auxiliary electrodes P41S and P42S may be metal films of Cu or the like formed by a sputtering method, for example.

The signal lines 31 to 34 are linear conductor patterns which extend in the transmission direction (X axis direction). The signal lines 31 to 34 include portions which extend in parallel or substantially in parallel to each other in the line portion SL. The signal lines 31, 32, 33, and 34 are arranged in the +Y direction in this sequence. In the present preferred embodiment, the signal lines 31 to 34 are disposed in the same layer in the Z axis direction.

The first ground conductor 41B is different from the first ground conductor 41 described in the first preferred embodiment in that a first conductor-non-formed portion NP10 is provided. The first ground conductor 41B is a rectangular or substantially rectangular conductor pattern. The first conductor-non-formed portion NP10 is an opening disposed in the central area of the first ground conductor 41A.

The second ground conductor 42B is different from the second ground conductor 42 described in the first preferred embodiment in that no conductor-non-formed portions are provided. The second ground conductor 42B is a rectangular or substantially rectangular conductor pattern. The remaining configuration of the second ground conductor 42B is the same or substantially the same as that of the second ground conductor 42.

The input/output electrodes P11 and P21 are electrically coupled to the signal line 31, the input/output electrodes P12 and P22 are electrically coupled to the signal line 32, the input/output electrodes P13 and P23 are electrically coupled to the signal line 33, the input/output electrodes P14 and P24 are electrically coupled to the signal line 34 (not illustrated). The first ground conductor 41B and the second ground conductor 42B are electrically coupled to each other, for example, through the auxiliary electrodes P41S and P42S.

As illustrated in FIG. 10, the signal lines 31 to 34 are disposed between the first ground conductor 41B and the second ground conductor 42B in the Z axis direction. A transmission line (microstrip line), which includes the signal lines 31 to 34 and the second ground conductor 42B, is provided in the line portion SL of the transmission line substrate 104. The distance D1 between the signal lines 31 to 34 and the first ground conductor 41B in the Z axis direction is less than the distance D2 between the signal lines 31 to 34 and the second ground conductor 42B in the Z axis direction (D1<D2).

Fifth Preferred Embodiment

A fifth preferred embodiment of the present invention describes an exemplary transmission line substrate in which multiple interlayer connection conductors, which connects ground conductors, are provided in the line portion.

Figure 11A:
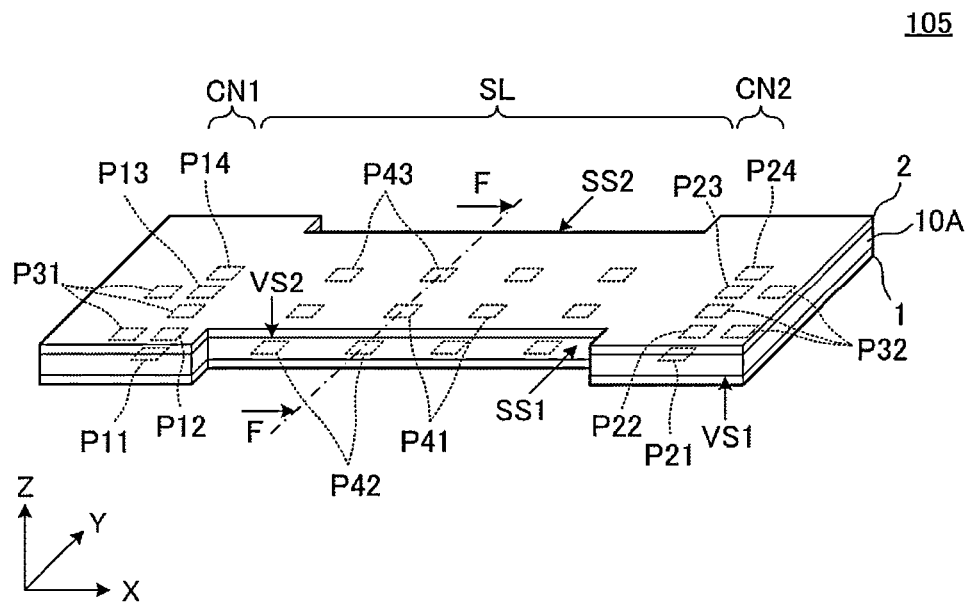
FIG. 11A is an external perspective view of a transmission line substrate 105 according to a fifth preferred embodiment.
Figure 11B:
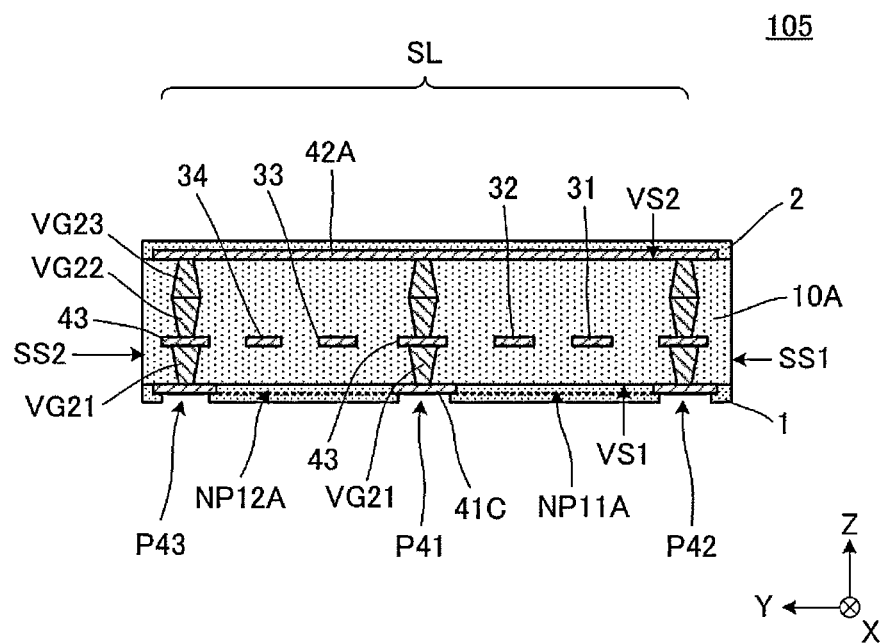
FIG. 11B is a cross-sectional view along F-F in FIG. 11A.

FIG. 11A is an external perspective view of a transmission line substrate 105 according to the fifth preferred embodiment. FIG. 11B is a cross-sectional view along F-F in FIG. 11A.

The transmission line substrate 105 is different from the transmission line substrate 103 according to the third preferred embodiment in that a first ground conductor 41C, the second ground conductor 42A, the four auxiliary electrodes P41, four auxiliary electrodes P42, and four auxiliary electrodes P43 are included. The remaining configuration of the transmission line substrate 105 is the same or substantially the same as that of the transmission line substrate 103.

Portions different from those of the transmission line substrate 103 according to the third preferred embodiment will be described below.

The first ground conductor 41C is different from the first ground conductor 41A described in the third preferred embodiment in that first conductor-non-formed portions NP11A and NP12A are provided. The first conductor-non-formed portions NP11A and NP12A are long openings which extend in the X axis direction. The first conductor-non-formed portions NP11A and NP12A are arranged in the +Y direction in this sequence.

The auxiliary electrodes P41, the auxiliary electrodes P42, and the auxiliary electrodes P43 are arranged in the +Y direction in this sequence. Specifically, the auxiliary electrodes P41 are disposed in central areas in the width direction (Y axis direction) in the line portion SL, the auxiliary electrodes P42 are disposed near the side surface SS1 in the line portion SL, the auxiliary electrodes P43 are disposed near the side surface SS2 in the line portion SL. The auxiliary electrodes P41 are the same or substantially the same as those described in the third preferred embodiment. The four auxiliary electrodes P41, the four auxiliary electrodes P42, and the four auxiliary electrodes P43 are arranged in the transmission direction (X axis direction).

The first ground conductor 41C and the second ground conductor 42A are electrically coupled to each other through the intermediate ground conductors 43 and the interlayer connection conductors VG21 to VG23.

In the present preferred embodiment, as illustrated in FIG. 11B, the grounds (the second ground conductor 42A, and intermediate ground conductors 43 and interlayer connection conductors VG21 to VG23) are disposed in three directions around the signal lines 31 and 32. That is, the signal lines 31 and 32 are surrounded by the grounds in three directions around the signal lines 31 and 32. The signal lines 33 and 34 are surrounded by the grounds (the second ground conductor 42A, and intermediate ground conductors 43 and interlayer connection conductors VG21 to VG23) in three directions around the signal lines 33 and 34. That is, the signal lines 33 and 34 are surrounded by the grounds in three directions around the signal lines 33 and 34. This configuration achieves sufficient isolation between the signal lines 31 and 32 and the signal lines 33 and 34, resulting in further improvements in the advantageous effects of reduction or prevention of the cross talk.

Sixth Preferred Embodiment

A sixth preferred embodiment of the present invention describes an example in which the auxiliary electrodes have a plane shape so as to extend in an oblique direction with respect to the transmission direction.

Figure 12:
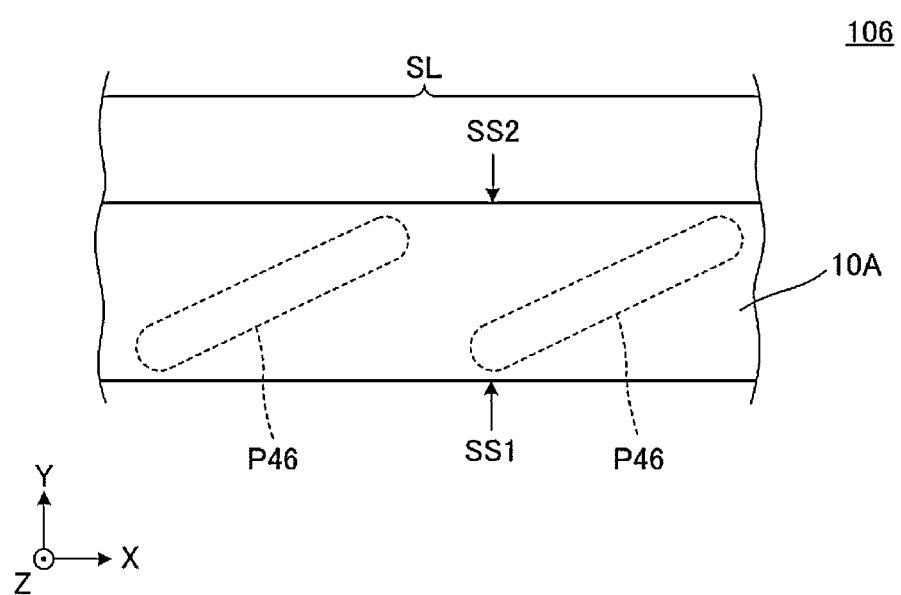
FIG. 12 is an enlarged plan view of a line portion SL of a transmission line substrate 106 according to a sixth preferred embodiment of the present invention.
Figure 13:
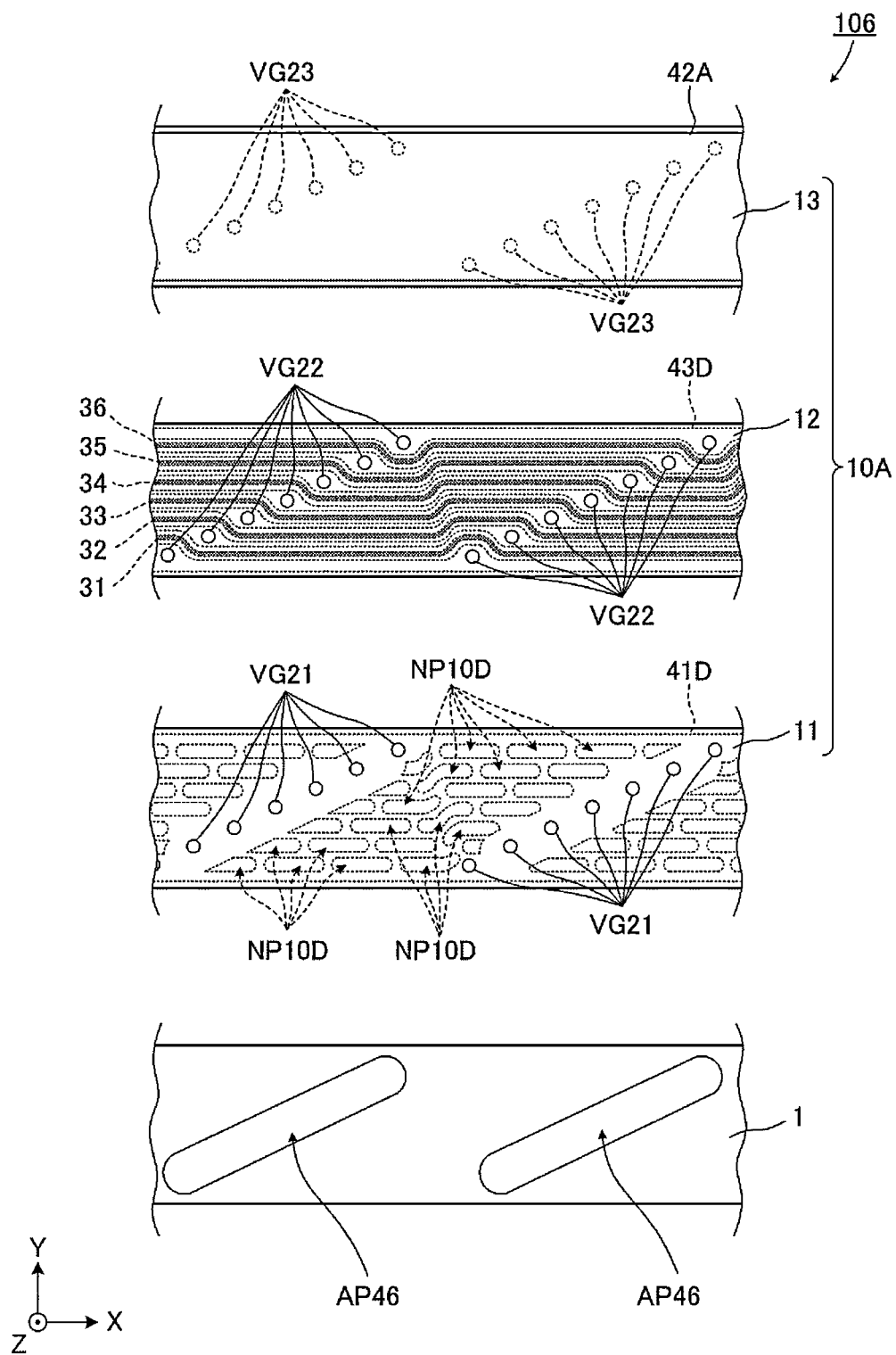
FIG. 13 is an exploded plan view of the line portion SL of the transmission line substrate 106.

FIG. 12 is an enlarged plan view of the line portion SL of a transmission line substrate 106 according to the sixth preferred embodiment. FIG. 13 is an exploded plan view of the line portion SL of the transmission line substrate 106. FIG. 13 illustrates signal lines 31, 32, 33, 34, 35, and 36 by using dot patterns for ease of understanding of the structure.

The transmission line substrate 106 is different from the transmission line substrate 103 according to the third preferred embodiment in that multiple auxiliary electrodes P46, the six signal lines 31, 32, 33, 34, 35, and 36, a first ground conductor 41D, and intermediate ground conductors 43D are included. The remaining configuration of the transmission line substrate 106 is the same or substantially the same as that of the transmission line substrate 103.

Portions different from those of the transmission line substrate 103 according to the third preferred embodiment will be described below.

The auxiliary electrodes P46 are provided on the first main surface VS1 side in the line portion SL. As illustrated, for example, in FIG. 12, each auxiliary electrode P46 has a planar shape which extends in the oblique direction with respect to the transmission direction (X axis direction).

The six signal lines 31 to 36 are linear conductor patterns which extend in the transmission direction (in or substantially in the X axis direction). The six signal lines 31 to 36 include portions which extend in parallel or substantially in parallel to each other in the line portion SL. The signal lines 31, 32, 33, 34, 35, and 36 are arranged in the +Y direction in this sequence.

The intermediate ground conductors 43D are disposed in the same layer as that of the signal lines 31 to 36 in the Z axis direction. Each intermediate ground conductor 43D is disposed between a corresponding adjacent pair of the signal lines 31 to 36, and extends along the signal lines 31 to 36 in the line portion SL.

The first ground conductor 41D is different from the first ground conductor 41A described in the third preferred embodiment in that the first ground conductor 41D has a mesh shape in which multiple first conductor-non-formed portions NP10D are provided. The first conductor-non-formed portions NP10D are long openings whose longitudinal direction is in or substantially in the X axis direction. In the present preferred embodiment, the first conductor-non-formed portions NP10D having the same or substantially the same shape are disposed periodically. More specifically, the first conductor-non-formed portions NP10D are staggered when viewed in the Z axis direction.

In the present preferred embodiment, each auxiliary electrode P46 has a planar shape which extends in the oblique direction with respect to the transmission direction (X axis direction). This configuration may make the range of change of the GND potential in the transmission direction small, compared with the case in which each auxiliary electrode has a planar shape which extends in the width direction (Y axis direction).

In the present preferred embodiment, the first conductor-non-formed portions NP10D having the same or substantially the same shape are disposed periodically. This configuration may make the range of change of the GND potential in the transmission direction small, and easily achieves continuity in the characteristic impedance in the line portion SL. The same is true for the second conductor-non-formed portions disposed in the second ground conductor.

The present preferred embodiment describes an example in which first conductor-non-formed portions NP10D that overlap the corresponding different signal lines are disposed adjacent to each other (overlap each other) in the width direction. However, this configuration is not limited thereto. Preferably, such first conductor-non-formed portions (which overlap the corresponding different signal lines) are not disposed adjacent to each other (do not overlap each other) in the width direction when viewed in the Z axis direction. This configuration enables reduction or prevention of cross talk between the signal lines. The same is true for the second conductor-non-formed portions disposed in the second ground conductor.

Other Preferred Embodiments

The preferred embodiments of the present invention above describe examples in which the input/output electrodes and the ground electrodes, which are disposed on the connection portions, are joined to substrate-side electrodes of a circuit substrate with a conductive jointing material interposed in between. However, this configuration is not limited thereto. On the connection portions of a transmission line substrate, for example, connectors (plugs) may be disposed to be connected to receptacles of a circuit substrate.

The preferred embodiments of the present invention above describe exemplary transmission line substrates including the two connection portions CN1 and CN2 and the single line portion SL. However, this configuration is not limited thereto. The number of connection portions included in a transmission line substrate and the number of line portions included in the transmission line substrate may be changed appropriately as long as the operation/advantageous effects of the present invention are achieved. The number of connection portions may be one and the number of line portions may be one. For example, when a transmission line substrate includes an antenna, the antenna, the line portion SL, and a connection portion may be disposed in the +X direction in this sequence.

The preferred embodiments of the present invention above describe examples in which the base included in the transmission line substrate is a rectangular or substantially rectangular flat plate. However, this configuration is not limited thereto. The shape of the multilayer body may be changed appropriately as long as the operation/advantageous effects of the present invention are achieved. The planar shape of the multilayer body may be, for example, a polygonal shape, a circular shape, an elliptical shape, an L-shape, a T-shape, a Y-shape, a U-shape, or a crank-shape.

The preferred embodiments of the present invention above relate to exemplary transmission line substrates including a base including three base layers. However, this configuration is not limited thereto. The number of stacked base layers included in the base may be changed appropriately as long as the operation/advantageous effects of the present invention are achieved. The first protective layer 1 and the second protective layer 2 are not necessary in a transmission line substrate.

The preferred embodiments of the present invention above describe examples in which the base includes multiple base layers made of thermoplastic resin. However, this configuration is not limited thereto. The base layers may be sheets made of thermosetting resin, for example. Alternatively, the base layers may be dielectric ceramic sheets of low temperature co-fired ceramics (LTCC), for example. The base may be a composite multilayer body including multiple resins. For example, thermosetting resin sheets such as glass/epoxy substrates and thermoplastic resin sheets may be stacked to form the base. Further, the base is not limited to being formed by heat-pressing (collectively pressing) the base layers so that the surfaces of the base layers are fused. Adhesive layers may be included between the base layers, for example.

The preferred embodiments of the present invention above describe exemplary transmission line substrates in which the distance D1 between the signal line(s) and the first ground conductor in the Z axis direction is less than the distance D2 between the signal line(s) and the second ground conductor in the Z axis direction. However, this configuration is not limited thereto. The distance D1 may be greater than the distance D2, or may be equal or substantially equal to the distance D2.

The preferred embodiments of the present invention above describe examples in which the transmission direction (in which the signal line extends) extends in the X axis direction. However, the transmission direction of the present invention is not limited thereto. The transmission direction may be, for example, in the Y axis direction or may bend in the X axis direction and the Y axis direction.

A circuit provided on or in such a transmission line substrate is not limited to the configuration according to the preferred embodiments described above, and may be changed appropriately as long as the operation/advantageous effects of preferred embodiments of the present invention are achieved. A circuit provided on or in the transmission line substrate may include, for example, a coil formed by using conductor patterns, a capacitor formed by using conductor patterns, and frequency filters such as various filters (a low pass filter, a high pass filter, a band pass filter, and a band-stop filter). The transmission line substrate may include, in addition to a transmission line which is a microstrip line, for example, other various transmission lines (such as a meandering line and a coplanar line, for example). Various electronic components such as chip components may be mounted on or embedded in the transmission line substrate.

The preferred embodiments of the present invention above describe exemplary transmission line substrates in which one, four, or six signal lines are disposed in the line portion. However, this configuration is not limited thereto. The number of signal lines (transmission lines) may be changed appropriately depending on the circuit configuration of the transmission line substrate. The signal lines may be used in the same system (the same frequency band), or may be used in corresponding different systems (different frequency bands).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line substrate comprising:
   a line portion;
   a plurality of connection portions;
   a base including a first main surface and a second main surface opposite to the first main surface;
   a first ground conductor on a side of the first main surface;
   a second ground conductor on a side of the second main surface;
   at least one signal line in the base and extending in a transmission direction;
   an input/output electrode on the side of the first main surface in the plurality of connection portions and connected to the at least one signal line; and a plurality of auxiliary electrodes on the side of the first main surface in the line portion; wherein the at least one signal line in the line portion is between the first ground conductor and the second ground conductor in a thickness direction of the base;

in the first ground conductor in the line portion, at least one first conductor-non-formed portion overlaps the at least one signal line in a plan view, the at least one first conductor-non-formed portion being a portion in which a conductor is not disposed;

in the second ground conductor in the line portion, at least one second conductor-non-formed portion overlaps the at least one signal line in the plan view, the at least one second conductor-non-formed portion being a portion in which a conductor is not disposed;

a total area of the at least one second conductor-non-formed portion is less than a total area of the at least one first conductor-non-formed portion;

each of the plurality of auxiliary electrodes is between two of the plurality of connection portions in the plan view; and the plurality of auxiliary electrodes are disposed in the transmission direction.

2. The transmission line substrate according to claim 1, wherein the plurality of auxiliary electrodes have a planar shape extending in an oblique direction with respect to the transmission direction.

3. The transmission line substrate according to claim 1, further comprising:
a second protective layer on the second main surface and having a relative permittivity higher than the relative permittivity of the base; wherein
the second protective layer covers the at least one second conductor-non-formed portion in the plan view.

4. The transmission line substrate according to claim 1, further comprising:
a first protective layer on the first main surface and having a relative permittivity higher than the relative permittivity of the base; wherein
the first protective layer covers the least one first conductor-non-formed portion in the plan view.

5. The transmission line substrate according to claim 1, wherein
the at least one signal line includes a plurality of signal lines including portions extending in parallel or substantially in parallel to each other in the line portion;
the at least one first conductor-non-formed portion includes a plurality of first conductor-non-formed portions; and
among the plurality of first conductor-non-formed portions, first conductor-non-formed portions that overlap the respective two adjacent ones of the plurality of signal lines are not disposed adjacent to each other in a width direction, the width direction being orthogonal or substantially orthogonal to the transmission direction.

6. An electronic device comprising:
the transmission line substrate according to claim 1; and
a circuit substrate with the transmission line substrate mounted thereon.

7. The electronic device according to claim 6, further comprising:
an active device closer to the second main surface than to the first main surface in the line portion.

8. The electronic device according to claim 6, further comprising:

an antenna closer to the second main surface than to the first main surface in the line portion.

9. The electronic device according to claim 6, further comprising a conductor for a circuit, the conductor being closer to the second main surface than to the first main surface in the line portion.

10. A transmission line substrate comprising:
a line portion;
a plurality of connection portions;
a base including a first main surface and a second main surface opposite to the first main surface;
a first ground conductor on a side of the first main surface;
a second ground conductor on a side of the second main surface;
at least one signal line in the base and extending in a transmission direction;
an input/output electrode on the side of the first main surface in the plurality of connection portions and connected to the at least one signal line; and
a plurality of auxiliary electrodes on the side of the first main surface in the line portion; wherein
the at least one signal line in the line portion is between the first ground conductor and the second ground conductor in a thickness direction of the base;
in the first ground conductor in the line portion, at least one first conductor-non-formed portion overlaps the at least one signal line in a plan view, the at least one first conductor-non-formed portion being a portion in which a conductor is not disposed;
in the second ground conductor in the line portion, a conductor-non-formed portion is not provided, the conductor-non-formed portion being a portion in which a conductor is not disposed;
each of the plurality of auxiliary electrodes is between two of the plurality of connection portions in the plan view; and
the plurality of auxiliary electrodes are disposed in the transmission direction.

11. The transmission line substrate according to claim 10, wherein the plurality of auxiliary electrodes have a planar shape extending in an oblique direction with respect to the transmission direction.

12. The transmission line substrate according to claim 2, wherein
the at least one signal line includes a plurality of signal lines including portions extending in parallel or substantially in parallel to each other in the line portion;
the at least one first conductor-non-formed portion includes a plurality of first conductor-non-formed portions; and
among the plurality of first conductor-non-formed portions, first conductor-non-formed portions that overlap the respective two adjacent ones of the plurality of signal lines are not disposed adjacent to each other in a width direction, the width direction being orthogonal or substantially orthogonal to the transmission direction.

13. The transmission line substrate according to claim 10, further comprising:
a first protective layer on the first main surface and having a relative permittivity higher than the relative permittivity of the base; wherein
the first protective layer covers the least one first conductor-non-formed portion in the plan view.

14. An electronic device comprising:
the transmission line substrate according to claim 10; and a circuit substrate with the transmission line substrate mounted thereon.

15. The electronic device according to claim 14, further comprising:
   an active device closer to the second main surface than to the first main surface in the line portion.

16. The electronic device according to claim 14, further comprising:
   an antenna closer to the second main surface than to the first main surface in the line portion.

17. The electronic device according to claim 14, further comprising a conductor for a circuit, the conductor being closer to the second main surface than to the first main surface in the line portion.

* * * * *